United States Patent [19]

Ralph

[11] Patent Number: 4,909,856
[45] Date of Patent: Mar. 20, 1990

[54] COMPOSITE COVERGLASS FOR SOLAR CELL

[75] Inventor: Eugene L. Ralph, San Gabriel, Calif.

[73] Assignee: Hughes Aircraft Company, Los Angeles, Calif.

[21] Appl. No.: 234,708

[22] Filed: Aug. 22, 1988

[51] Int. Cl.$^4$ .............................................. H01L 31/06
[52] U.S. Cl. ........................................ 136/256; 357/30
[58] Field of Search ............. 136/256; 357/30 J, 30 L

[56] References Cited

U.S. PATENT DOCUMENTS 4,151,005  4/1979  Strebkov et al. ................... 136/256

OTHER PUBLICATIONS

T. Hayashi et al., *Conference Record, 19th IEEE Photovoltaic Specialists Conf.*, (1987), pp. 475–478.

*Primary Examiner*—Aaron Weisstuch
*Attorney, Agent, or Firm*—Steven M. Mitchell; Wanda K. Denson-Low

[57] ABSTRACT

A photovoltaic device is formed of a module of photovoltaic material, the module including electrodes disposed on the material for extraction of electric power produced by interaction of the material with radiation, particularly solar radiation. A coverglass system is disposed on a surface of the module facing incident radiation to protect the module from high energy particles. The coverglass system is formed of a glass sheet disposed parallel to a surface of the module, and a slab or a plurality of glass slabs which are disposed in a side-by-side array along the module surface between the module and the sheet. The slabs are thicker than the sheet, typically by a factor of two, and are formed of fused silica to provide a sufficient mass for stopping high energy particles such as those which may be encountered in a spaceship traveling through a Van Allen belt. Adhesive layers may be employed for bonding the slabs together as well as to the module and to the sheet, in which case, the sheet is formed of a borosilicate glass which attenuates ultraviolet radiation so as to protect the adhesive layers from degradation by ultraviolet radiation.

16 Claims, 1 Drawing Sheet

COMPOSITE COVERGLASS FOR SOLAR CELL

BACKGROUND OF THE INVENTION

This invention relates to the construction of photovoltaic devices and, more particularly, to the construction of a coverglass of a solar cell wherein the coverglass is constructed of an array of thick slabs of glass enclosed by a thin sheet of glass.

Photovoltaic devices are formed of photovoltaic material which interacts with electromagnetic radiation, such as visible light and infrared radiation, by a photoelectric effect wherein incident photons are absorbed and converted to electron-hole pairs. Typically, the photovoltaic devices are formed of layers of different semiconductive photovoltaic material which produce PN junctions at interfaces between the materials. Upon conversion of incident photons to the electron-hole pairs, photovoltages are developed across the PN junctions while photocurrent is supplied to an external load.

Photovoltaic devices are widely used as solar cells in spacecraft for converting solar radiation to electric power used in the performance of spacecraft functions, such as vehicular guidance and communication. Various semiconductor materials having differing bandgap energies may be employed to attain power conversion, from radiant power to electric power, over a band of the solar spectrum; the band may be increased by use of more of the materials. In addition to the generation of electric power, the conversion process also generates heat which is dissipated within the solar cell, and is to be removed from the cell so as to retain an acceptably low operating temperature of the solar cell. It is noted that an excessive rise in temperature of the solar cell reduces the effectiveness and efficiency of the cell operation.

Spacecraft may encounter radiation with high energy particles such as protons and electrons which may impinge upon the solar cell. Such high energy particles interact with the photovoltaic material of the solar cell to alter the conversion characteristics of the semiconductor photovoltaic material with a consequent reduction in the utility of the solar cell. Therefore, it is useful to construct a solar cell with a protective cover, such as a cover glass, which is transparent to the incident radiation, has sufficient mass to protect the cell from high energy particles, and allows for emission of heat.

An attempt has been made to provide an adequate coverglass by employing a thick coverglass fabricated of fused silica or other suitable radiation resistant transparent materials. The silica is made thick enough to inhibit the passage of high energy particles.

A problem arises in that the thick layers of fused silica are far more expensive than desired because such covers must be cut from silica ingots, and must be polished and coated with an ultraviolet (UV) rejection filter plus an antireflective coating. For space travel in regions which do not have the high energy particles found in certain of the Van Allen belts, a thinner coverglass made of ceria-doped sodium line glass can be employed to provide protection from weaker atomic particles. The ceria-doped sodium lime glass should not be formed as a thick glass element because such thick elements have higher absorption of radiant energy than fused silica, and cannot be used without a large transmittance penalty.

SUMMARY OF THE INVENTION

The foregoing problem is overcome and other advantages are provided by a photoelectric device, particularly a solar cell, for the conversion of solar power to electric power, the solar cell employing a module of layers of semiconductive photovoltaic material, and further including, in accordance with the invention, a coverglass system employing both thin and thick elements. The thick elements are formed of a single slab or a multitude of slabs of material which are smaller than a front face of the module, and are arranged in an array along the front face of the module.

The thick elements are formed as a slab or slabs of fused silica or other suitable material, polishing of the slabs and coatings thereon not being required. The slabs are mounted to the front face of the photovoltaic module by an adhesive, such as a silicone, the same adhesive being employed to secure the array of slabs to a back side of the thin element. The thin element is formed as a relatively thin sheet of glass which covers the entire array of glass slabs, and is secured thereto by an adhesive such as a silicone. The resulting composite structure has the beneficial properties of each material, such as the UV cut-off properties and radiation resistance provided by the thin glass element, and the good transmission of the fused silica. It also can provide a controlled thermal expansion characteristic depending on the materials used and the thicknesses. In addition, the structure of the invention provides for a selection in the size of the optical elements of the coverglass so as to facilitate manufacture and effect a cost savings.

BRIEF DESCRIPTION OF THE DRAWING

The aforementioned aspects and other features of the invention are explained in the following description, taken in connection with the accompanying drawing wherein.

DETAILED DESCRIPTION

Figure 1:
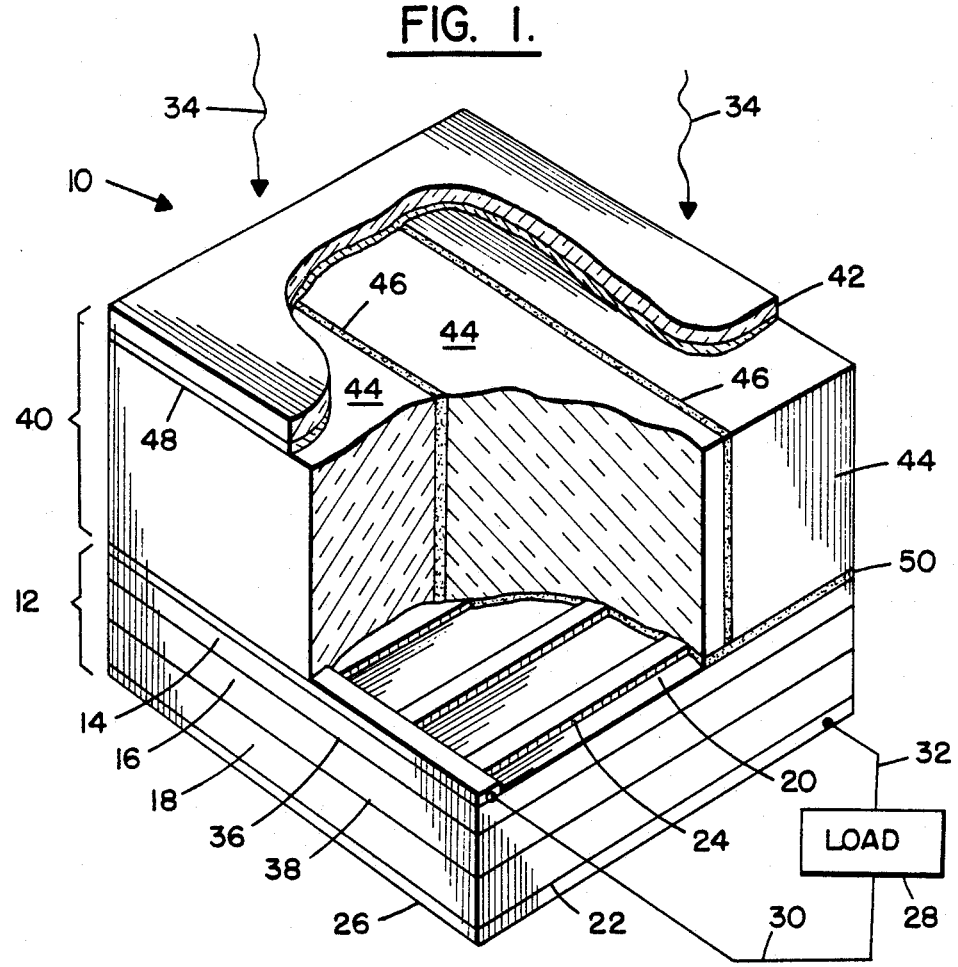
FIG. 1 is a perspective view, somewhat stylized, of a solar cell employing a coverglass system of the invention, portions of the cell being cut away to disclose interior structure.

With reference to FIG. 1, there is shown a photovoltaic device in the form of a solar cell assembly 10 which comprises a module 12 of photovoltaic material. The module 12 is constructed of multiple layers of the material, three such layers 14, 16, and 18 being shown by way of example. The module 12 has a front face 20 at a surface of the layer 14 and a back face 22 at a surface of the layer 18. A front electrode 24, constructed in the form of a grid, is disposed on the front face 20. A back electrode 26, constructed in the form of a plate, is disposed on the back face 22. The module 12 supplies electric current to a load 28 by wires 30 and 32 connected, respectively, to the front and the back electrodes 24 and 26.

The module 12 operates in response to incident solar radiation, indicated by arrows 34, to convert photons of the radiation to electron-hole pairs within the photovoltaic material of the module 12. PN junctions are provided at interfaces between layers of the photovoltaic material, two such junctions 36 and 38, respectively, being shown by way of example by interfaces between the layers 14 and 16, and between the layers 16 and 18. It is to be understood that the construction of the module 12, as shown in FIG. 1, has been simplified from such structures shown in the prior art, and that additional layers, such as buffer layers (not shown) may be included within the module 12. Due to the photovoltaic effect, the interaction with the radiation 34 results in the generation of voltages across the PN junctions 36 and 38, and the generation of a photocurrent through the load 28.

In accordance with the invention, the solar cell assembly 10 further comprises a coverglass system 40 located on the front face 20 of the module 12. The coverglass system 40 includes a glass sheet 42 oriented parallel to the front face 20, and a slab or an array of glass slabs 44 disposed side-by-side along the front face 20 and behind the sheet 42. The slabs 44 are secured together by adhesive layers 46, and are secured to the sheet 42 by an adhesive layer 48. The array of slabs 44 is secured to the front electrode 24 and to the front surface of the layer 14 by an adhesive layer 50. The coverglass system 40 is transparent to the spectral band of solar radiation with which the module 12 interacts to produce the electric power.

Figure 2:
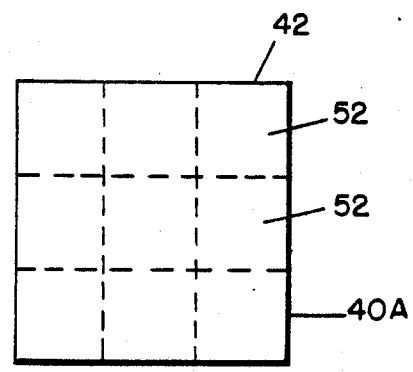
FIG. 2 is a plan view of a front of the cell of FIG. 1 with an array of nine square-shaped blocks of fused silica arranged in a square, as shown by phantom lines.

In FIG. 2, an array of glass slabs 52 having a square shape, and being arranged in a square array of nine slabs may be employed in lieu of the set of three rectangular slabs 44 disclosed in FIG. 1. The arrangement of the slabs 52 is covered by a glass sheet such as the glass sheet 42 of FIG. 1 to provide a cover glass system 40A in which a larger number of smaller slabs is employed. In the system 40A of FIG. 2, the slabs 52 are secured by adhesive layers (not shown) to each other, to the glass sheet 42, and to the front face of the module 12 in the same fashion as was disclosed for FIG. 1.

The glass slabs 44, as well as the slabs 52, are formed of fused silica or other suitable material and may be provided with a thickness typically in the range of 30 to 60 mils depending on the amount of protection from high energy particles which may be required. This requirement varies with the trajectory of the spacecraft in relation to radiation associated with the Van Allen belts. The glass sheet 42 is fabricated of borosilicate glass and has a thickness typically in the range of 3 to 6 mils. The glass sheet 42 inhibits the propagation of ultraviolet radiation and, therefore, protects the adhesive layers 46, 48, and 50 from degradation which is produced by ultraviolet radiation. It is noted also that in lieu of the silicone adhesive, other methods of bonding the glass slabs 44 to each other and to the glass sheet 42 can be employed, such as a polyfluorinated material as in Teflon bonding, or by electrostatic fusion. In the construction of the cell assembly 10, the slabs 44 may be bonded to the sheet 42 prior to adhesion of the cover glass system 40 to the photovoltaic module 12 or, alternatively, the slabs 44 may be mounted first to the module 12 after which the sheet 42 is secured to the front faces of the slabs 44. The borosilicate glass may be doped with ceria to provide still further resistance against the high energy particles in the Van Allen radiation. By way of example in the construction of the cell assembly 10, each of the slabs 44 may have a front face with dimensions of 6 centimeters in length by 2 centimeters in width.

A feature of the fused silica and the borosilicate glass is the fact that these glasses increase the emissivity of heat radiation from the cell assembly 10 to enhance cooling of the cell. Also, the adhesive layers 46 have elasticity so as to permit transverse elongation and contraction of the slabs 44 along the front face 20 of the module 12 in response to changes in temperature of the cell assembly 10. The provision for transverse motion reduces the magnitude of any stresses which may build up, due to differential thermal elongation, at the interface between the coverglass system 40 and the module 12. This also results in a controlled expansion characteristic of the coverglass system. The adhesive layers 46, 48 and 50 may be on the order of approximately 1–2 mils thick. In the event that the module 12 is to be illuminated with radiation from opposite directions, then the coverglass system 40 may be applied to both the front and the back faces of the module. Also, if desired, an antireflective coating may be applied to the outer surface of the glass sheet 42. The foregoing structure offers a significant savings in cost because of the much increased ease of manufacture provided by use of relatively small slabs of fused silica, rather than one large thick cover element of fused silica as has been attempted heretofore.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

What is claimed is:

1. A photovoltaic device including a coverglass system, comprising a glass sheet, a plurality of glass slabs disposed between said sheet and a surface of a photovoltaic module, and a plurality of elastic layers, said slabs being arranged side-by-side along said module surface, the thickness of said slabs being greater than the thickness of said sheet; and wherein individual ones of said elastic layers are disposed respectively along interfaces between adjacent ones of said slabs, and each of said elastic layers have elasticity to permit transverse elongation and contraction of said slabs along said module surface in response to a change in temperature of said slabs, thereby to inhibit a buildup of thermally induced stresses at an interface between said slabs and said module.

2. A device according to claim 1 wherein said slabs are bonded together along interfacing surfaces between said slabs, and are bonded to said sheet.

3. A device according to claim 1 wherein a bonding between said slabs and said sheet is accomplished by an elastic layer, said elastic layers being formed of an adhesive, said sheet being composed of a glass which inhibits propagation of ultraviolet radiation for protecting said elastic layer from ultraviolet radiation.

4. A device according to claim 3 wherein said sheet is composed of a borosilicate glass.

5. A device according to claim 4 wherein said slabs are formed of fused silica.

6. A device according to claim 5 wherein the thickness of said slabs is greater than the thickness of said sheet by at least approximately a factor of two.

7. A device according to claim 3 wherein said slabs are formed of fused silica.

8. A device according to claim 1 wherein the thickness of said slabs is greater than the thickness of said sheet by at least approximately a factor of two.

9. A photovoltaic device comprising:
a module of photovoltaic material, said module including electrodes disposed on said photovoltaic material for extraction of electric power produced by interaction of said material with radiation in a predetermined spectral band; and a coverglass system disposed on a surface of said module for protecting said module from high energy particle radiation and radiation at frequencies outside the predetermined spectral band and also providing thermal expansion control at the coverglass system; and wherein said coverglass system comprises a glass sheet, a plurality of glass slabs disposed between said sheet and said module, and a plurality of elastic layers, said slabs being arranged side-by-side along said module surface, the thickness of said slabs being greater than the thickness of said sheet; and wherein individual ones of said elastic layers are disposed respectively along interfaces between adjacent ones of said slabs, and each of said elastic layers have elasticity to permit transverse elongation and contraction of said slabs along said module surface in response to a change in temperature of said slabs, thereby to inhibit a buildup of thermally induced stresses at an interface between said slabs and said module.

10. A device according to claim 9 wherein said slabs are bonded together along interfacing surfaces between said slabs, and are bonded to said sheet.

11. A device according to claim 10 wherein a bonding between said slabs and said sheet is accomplished by an elastic layer, said elastic layers being formed of an adhesive, said sheet being composed of a glass which inhibits propagation of ultraviolet radiation for protecting said elastic layer from ultraviolet radiation.

12. A device according to claim 11 wherein said sheet is composed of a borosilicate glass.

13. A coverglass system according to claim 12 wherein said slabs are formed of fused silica.

14. A device according to claim 13 wherein the thickness of said slabs is greater than the thickness of said sheet by at least approximately a factor of two.

15. A device according to claim 11 wherein said slabs are formed of fused silica.

16. A device according to claim 9 wherein the thickness of said slabs is greater than the thickness of said sheet by at least approximately a factor of two.

* * * * *